(12) United States Patent
DeHeer (10) Patent No.: US 7,989,067 B2
(45) Date of Patent: Aug. 2, 2011

(54) INCORPORATION OF FUNCTIONALIZING MOLECULES IN NANOPATTERNED EPITAXIAL GRAPHENE ELECTRONICS

(75) Inventor: Walt A. DeHeer, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 1121 days.

(21) Appl. No.: 11/745,246

(22) Filed: May 7, 2007

(65) Prior Publication Data

US 2007/0287011 A1 Dec. 13, 2007

Related U.S. Application Data

(60) Continuation-in-part of application No. 11/302,868, filed on Dec. 14, 2005, now Pat. No. 7,327,000, which is a division of application No. 10/860,710, filed on Jun. 3, 2004, now Pat. No. 7,015,142.

(60) Provisional application No. 60/798,651, filed on May 8, 2006, provisional application No. 60/477,997, filed on Jun. 12, 2003.

(51) Int. Cl.
B32B 9/00 (2006.01)
(52) U.S. Cl. .................... 428/408; 423/447.1
(58) Field of Classification Search ............ 428/408; 423/447.1, 445 R; 977/742; 264/29.1
See application file for complete search history.

(56) References Cited

U.S. PATENT DOCUMENTS

| 4,898,557 | A | 2/1990 | Engemann |
|---|---|---|---|
| 5,647,998 | A | 7/1997 | Potter |
| 5,993,697 | A | 11/1999 | Cohen et al. |
| 6,136,160 | A | 10/2000 | Hrkut et al. |
| 6,159,558 | A | 12/2000 | Wolfe et al. |
| 6,515,339 | B2 | 2/2003 | Shin et al. |
| 6,540,972 | B1 | 4/2003 | Hiura |
| 7,449,133 | B2 * | 11/2008 | Gruner et al. ........... 252/511 |
| 2002/0009637 | A1 | 1/2002 | Murakami et al. |
| 2002/0014667 | A1 | 2/2002 | Shin et al. |

FOREIGN PATENT DOCUMENTS

WO   WO 03/018871 A2   3/2009

OTHER PUBLICATIONS

Wu, et al., "Graphenes as Potential Material for Electronics," Chem. Rev. 2007, Apr. 4, 2006, vol. 107, pp. 718-747.
Jones, "Annealing ion implanted SiC with an AlN cap," Materials Science and Engineering B61-62 (1999) 281-286.
Supplementary European Search Report; European Application No. EP 04 77 6253 (claiming priority on parent of present application).
PCT International Search Report and Written Opinion (ISA 220, ISA 210, ISA 237); PCT/US04/17537 (claiming priority on parent of present application).

* cited by examiner

Primary Examiner — David R Sample
Assistant Examiner — Daniel Miller
(74) Attorney, Agent, or Firm — Bryan W. Bockhop; Bockhop & Associates, LLC (57) ABSTRACT

In a method of making graphite devices, a thin-film graphitic layer disposed against a preselected face of a substrate is created on the preselected face of the substrate. A preselected pattern is generated on the thin-film graphitic layer. At least one functionalizing molecule is attached to a portion of the graphitic layer. The molecule is capable of interacting with π bands in the graphitic layer.

20 Claims, 6 Drawing Sheets

INCORPORATION OF FUNCTIONALIZING MOLECULES IN NANOPATTERNED EPITAXIAL GRAPHENE ELECTRONICS

CROSS-REFERENCE TO A RELATED PATENT APPLICATION

The present application claim is Continuation-in-Part of U.S. patent application Ser. No. 11/302,868, filed on Dec. 14, 2005 now U.S. Pat. No. 7,327,000, entitled "PATTERNED THIN FILM GRAPHITE DEVICES AND METHOD FOR MAKING SAME," which is a Divisional application of U.S. patent application Ser. No. 10/860,710, filed on Jun. 03, 2004, entitled "PATTERNED THIN FILM GRAPHITE DEVICES AND METHOD FOR MAKING SAME," which issued as U.S. Pat. No. 7,015,142 on Mar. 21, 2006, the entirety of which is incorporated herein by reference into the disclosure of the present application.

CROSS-REFERENCE TO A PROVISIONAL PATENT APPLICATION

The present application claims priority on U.S. Provisional Patent Application Ser. No. 60/798,651, filed on May 8, 2006, entitled "EXPANDING THE ELECTRONIC FUNCTIONALITY OF PATTERNED GRAPHITE STRUCTURES BY INCORPORATING MOLECULES IN NPEG STRUCTURES" and U.S. Provisional Patent Application Ser. No. 60/477,997, filed Jun. 12, 2003, entitled "METHOD TO MAKE INTEGRATED AND DISCRETE ELECTRONIC COMPONENTS FROM STRUCTURED THIN GRAPHITIC MATERIALS," the entirety of which is incorporated herein by reference into the disclosure of the present application.

STATEMENT OF GOVERNMENT INTEREST

This invention was made with U.S. Government support under agreement number ECS-0404084 awarded by the National Science Foundation. The Government has certain rights in this invention.

BACKGROUND OF THE INVENTION

1. Field of the Invention

The present invention relates to thin film electronic devices and, more specifically, to a system for making thin film graphitic devices.

2. Description of the Prior Art

In modern microelectronics integrated-circuit technology, a silicon wafer is lithographically patterned to accommodate a large number of interconnected electronic components (field effect transistors, resistors, capacitors, etc). The technology relies on the semiconducting properties of silicon and on lithographic patterning methods. Increasing the density of electronic components and reducing the power consumption per component are two of the most important objectives in the microelectronics industry, which has driven the steady reduction in the size of the components in the past decades. However, miniaturization of silicon-based electronics will reach an ultimate limit in the near future, primarily because of limitations imposed by the material properties of silicon, and doped silicon, at the nanoscale.

To sustain the current trend in microelectronics beyond the limits imposed by silicon-based microelectronics technologies, alternative technologies need to be developed. Requirements for such an alternative technology include: smaller feature sizes than feasible with silicon-based microelectronics, more energy-efficient electronics strategies, and production processes that allow large-scale integration, preferably using lithographic patterning methods related to those used in silicon-based microelectronics fabrication.

Several alternatives to silicon-based electronics have been proposed. However, none of the proposed alternatives fulfills all three of the above-listed requirements. For example, molecular electronics is considered to be an attractive alternative to silicon-based electronics. Molecular electronics devices will rely on electronic transport properties through molecules.

One proposed example of molecular electronics employs carbon nanotubes, which are considered to be particularly attractive candidates as building blocks of molecular electronics. Carbon nanotubes are essentially graphite tubes consisting of one to about 100 graphene layers in tubular configurations. A graphene layer consists of a single layer of carbon atoms arranged in a hexagonal pattern where each atom (except those at the edges) is chemically connected to its three neighbors by $sp^2$ bonds. Crystalline graphite consists of stacked graphene layers.

The electronic transport properties of carbon nanotubes are due to the $\pi$ bands of the graphene network. Hence, the electronic properties are directly related to their graphitic structure. Properties of nanotubes include the following: they conduct electrons in either a metallic mode or a semiconducting mode depending on their specific structure; they have been found to be one-dimensional ballistic conductors over micron-scale distances at room temperature; the bandgap of semiconducting nanotubes depends on the diameter of the nanotube, hence it can be tuned depending on its width; they can sustain very large currents (up to 1 mA); they are essentially graphitic and the $sp^2$ graphite bond ranks among the strongest in nature, making nanotubes exceptionally stable compared to other molecules; and they have been shown to be capable of forming field-effect transistors. Small integrated circuits, involving up to three carbon nanotubes have been demonstrated. These structures consist of several carbon nanotubes that are deposited on an insulating substrate and interconnected with metal wires that are lithographically patterned on top of the nanotubes.

Despite the advantages mentioned above, there are also important disadvantages associated with carbon nanotube-based molecular electronics. For example, since nanotubes are either metallic or semiconducting they must be pre-selected before they are positioned on the substrate. This aspect by itself currently prohibits large-scale integration of nanotubes. Also, present nanotube configurations are interconnected with metal wires. The Ohmic resistance at each metal-to-nanotube contact is quite large. For example, in the "on" condition, each carbon nanotube transistor exhibits a resistance of several kilo Ohms which means that relatively large amounts of heat are dissipated at the contacts compared with silicon transistors.

Because of these disadvantages, nanotubes are not used yet in commercial integrated electronic circuits. Moreover, integration of carbon nanotube-based electronic devices on a large scale is not expected to be feasible in the foreseeable future.

Nano-patterned epitaxial graphene electronics (NPEG electronics) requires that single- or multi-layered graphene or ultra thin graphite is patterned in order to produce electronically active structures. Ultra thin graphitic layers include graphitic structures from a single graphene layer to up to 100 graphene layer. Ultra thin graphene includes both multilayered graphene as well as multilayered graphite. The generic patterned multilayered graphene (also known as ultra thin graphite) structure consists of one or more graphitic leads that connect to π conjugated structures. These π conjugated electronic systems may be formed ' by patterning the epitaxial graphene multi-layers directly using patterning methods (known as the top-down approach).

It is desirable that electronic structures can be patterned at the nanoscale. However, very small structures become increasingly sensitive to variations as structures that are different by the position of only a few atoms may significantly alter the electronic performance of the structure. Consequently, to insure that very small electronic structures have reproducible properties they must be patterned reproducibly. Ideally one would like to achieve precise control on the molecular level on the structure of the electronically active device. The developing field of molecular electronics recognizes the importance of control on the atomic scale. This field of electronics capitalizes on the fact that molecules can be chemically prepared and subsequently they can be incorporated into electronic structures (also known as the bottom-up approach). In traditional molecular electronics, molecules are typically attached to metallic contacts in order to incorporate them into electronically functional structures. However, the metal to molecule contact typically has poor electronic characteristics. Furthermore, it is difficult to control the metal to molecule contact on the atomic scale.

Recent developments in nano-electronics have born out that graphite-based materials have many advantageous electronic properties over metals and semiconductors. These advantages include the very high current carrying abilities of graphitic structures, ballistic and coherent transport, and the fact that graphitic structures can be either metallic or semiconducting depending on their shape, as has been reported in the scientific literature.

Graphene structures transport electronic currents due to the π bonds. These π bonds result from the overlap of the $p_z$ electronic orbitals of a carbon atom with its three carbon neighbors. For extended graphite based structures, like graphite or graphite ribbons, the π bonds give rise to π bands. If the π bands intercept the Fermi level then these bands can transport electrical currents analogous to the electronic bands in metals. Hence, properly nano-patterned graphite ribbons can serve as wires to conduct electrical currents, that is, they can serve as electronic conduits. These principles form the basis of NPEG electronics.

In order to add electronic functionality to electronic structures, an electronic current must pass through a specific molecular structure whose electronic transport properties can be controllably modified. This is typically done by applying a gate potential that affects the electronic transport through the molecular structure. Alternatively, the molecular structure can be exposed to a chemical environment that affects the electronic transport through it. Hence, the molecular structure may be designed to be a chemical sensor. Magnetic fields may also affect the electronic transport through a structure.

Therefore, there is a need for an electronic device technology that includes graphitic structures that are functionalized.

SUMMARY OF THE INVENTION

The disadvantages of the prior art are overcome by the present invention which, in one aspect, is a method of making graphite devices in which a preselected face of a substrate is annealed to create a thin-film graphitic layer disposed against preselected face. A preselected pattern is generated on the thin-film graphitic layer.

In another aspect, the invention is a functional structure that includes a crystalline substrate having a preselected crystal face. A thin-film graphitic layer is disposed on the preselected crystal face. The thin-film graphitic layer is patterned so as to define at least one functional structure.

In another aspect, the invention is an active electronic device, that includes an electron source area, an electron target area, a substantially flat graphitic strip and a first gate area. The electron target area is spaced apart from the electron source area. The substantially flat graphitic strip is in electronic communication with the electron source area and the electron target area. The graphitic strip has at least one dimension that includes less than one hundred graphene layers. The first gate area is disposed relative to a first portion of the graphitic strip so that when electronic charge is applied to the first gate area a field is generated that affects an electron transport quality through the first portion of the graphitic strip.

In another aspect, the invention is a method of making graphite devices in which a thin-film graphitic layer disposed against a preselected face of a substrate is created on the preselected face of the substrate. A preselected pattern is generated on the thin-film graphitic layer. At least one functionalizing molecule is attached to a portion of the graphitic layer. The organic molecule is capable of interacting with π bands in the graphitic layer.

In yet another aspect, the invention is a functional structure that includes a crystalline substrate having a preselected crystal face and a thin-film graphitic layer disposed on the preselected crystal face. The thin-film graphitic layer is patterned so as to define at least one functional structure. A functionalizing molecule is bound to a portion of the graphitic layer so as to modify an electrical property of the portion of the graphitic layer.

Integrated electronics based on ultra-thin graphite film (UTGF) have several advantages over prior art, these include: large-scale integration is possible using standard microelectronics lithography methods; metals are not used to interconnect the devices so that metal-to-graphite contact resistances are avoided and power dissipation at the contacts is greatly reduced or eliminated; integrated electronic device structures whose operation relies on quantum interference effects can be constructed; feature sizes as small as 1 nm scale are possible and limited only by the lithography methods; and graphite can be electronically modified by chemically bonding molecules to the edges of graphite strips, without damaging the graphitic structure.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." "Annealing" includes processes in which a substance is heated to a temperature that causes a physical change in the substance, and is not limited to the heating and cooling of metals.

Figures 1A, 1B:
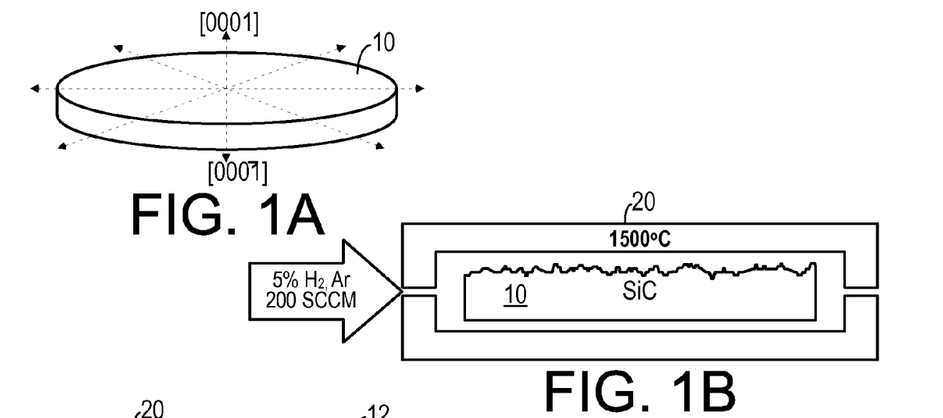
FIGS. 1A-1I are schematic diagrams showing a series of process steps according to one illustrative embodiment of the invention.

As shown in FIG. 1A, one method of making a device according to the invention begins with a substrate 10, such as a crystalline substrate. One example of a crystalline substrate includes silicon carbide. In one embodiment, a 6 H crystal of silicon carbide was used and a device according to the invention was produced on the [0001] face of the crystal. As will be appreciated by those of skill in the art, other crystal types (e.g., 3C and 4H, etc.) and other crystal faces may be employed without departing from the scope of the invention.

As shown in FIG. 1B, the substrate 10 (a cross sectional view is shown in FIG. 1B) may have an irregular surface that should be flattened. Flattening may be accomplished by exposing the face of the substrate to a reactive gas at a first temperature and first flow pressure for a first amount of time sufficient to remove surface irregularities from the preselected crystal face. For example, a silicon carbide substrate may be placed in a reaction vessel 20 and heated to around 1500° C. with hydrogen gas (in a concentration of about 5% in argon, or some other substantially inert gas) flowing around the substrate 10 at a flow rate of about 200 SCCM for about 20 minutes.

Figure 1C:
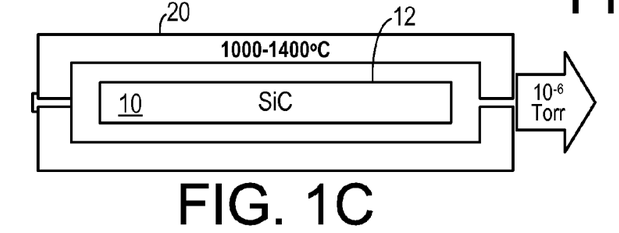
Figure 1D:
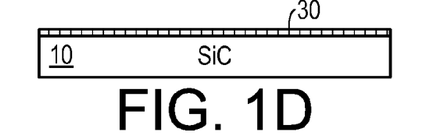

To create a graphitic layer on the flattened surface 12 of the substrate 10, as shown in FIG. 1C, the substrate 10 is heated to about 1000° C. to 1400° C. for about 20 minutes at a vacuum of about $10^{-6}$ Torr. This process may be referred to as "annealing" and it results in the formation of a thin-film graphitic layer 30 on the substrate 10, as shown in FIG. 1D. In another illustrative embodiment, the annealing step includes electron beam heating of the substrate 10 at a pressure of substantially $10^{-10}$ Torr for between 1 minute and 20 minutes. The thin-film graphitic layer 30 could be a graphene layer, which implies only a single layer of carbon atoms forms the layer, or a graphite layer, which implies a plurality of graphene layers. While a minimal number of graphene layers is preferred in some applications, up to 100 graphene layers may be formed without departing from the scope of the invention. (While the vessel 20 is no longer shown for the sake of simplicity, it is readily appreciable that several of the processes employed will take place in some kind of vessel, of a type that would be readily appreciable by those of skill in the chemical arts.)

Figure 1E:
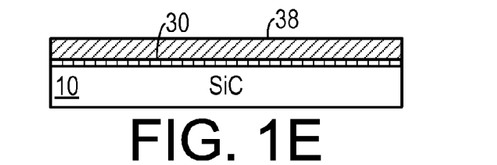
Figure 1F:
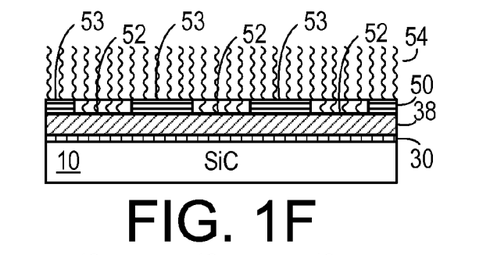
Figure 1G:
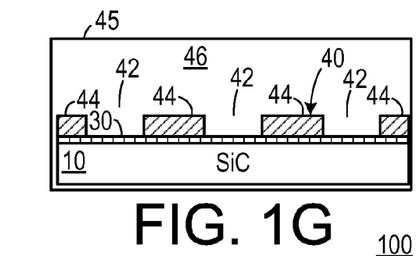

As shown in FIGS. 1E-1G, a mask 40 is created on the graphitic layer 30 for the purpose of etching (or otherwise removing graphite) a pattern onto the graphitic layer 30. A photo-resist 38 may be applied to the graphitic layer 30 and a pattern 50 (such as a mask negative) corresponding to a desired functional structure is applied to the photo-resist 38. The pattern 50 includes a first translucent or transparent region 52 and a second opaque region 53.

The pattern 50 is exposed to a predetermined electromagnetic energy 54, thereby causing structural change in exposed portions of the photo-resist 38. The photo-resist 38 is then developed so as to remove undesired portions of the photo-resist 38, thereby creating the mask 40 that corresponds to a desired functional structure (such as a transistor).

Figure 1H:
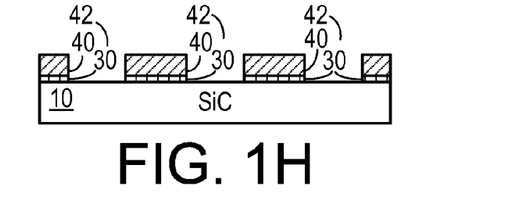
Figure 1I:
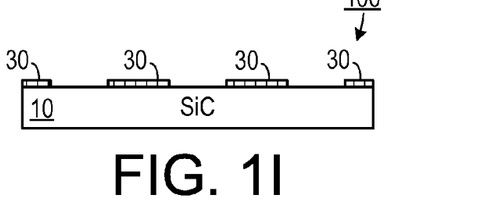

The mask 40 includes at least one non-masking region 42 in which a portion of the thin-film graphitic layer 30 is exposed to an environment 45 and at least one masking region 44 in which a second portion of the thin-film graphitic layer 30 is not exposed to an environment 45. A reactive substance 46 is released into the environment 45. The reactive substance 46 could be one of many substances that are reactive with graphite. For example, an ionic plasma, such as an oxygen plasma, may be employed as a reactive substance 46. The reactive substance 46 removes graphite from the thin-film graphitic layer 30 so as to form a functional structure 100 in the thin-film graphitic layer 32, as shown in FIGS. 1H and 1I.

Figure 2A:
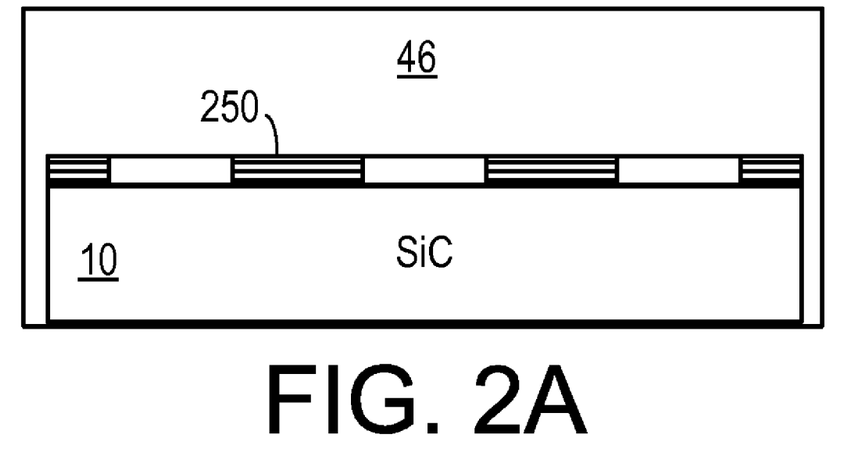
FIG. 2A-2C are schematic diagrams showing a series of process steps according to a second illustrative embodiment of the invention.
Figure 2B:
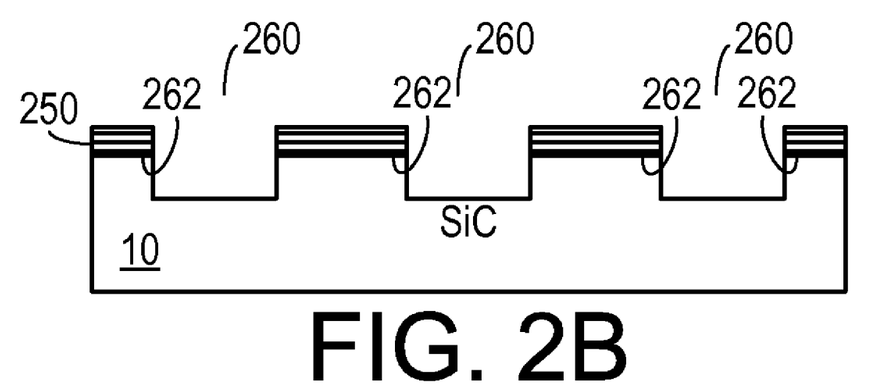
Figure 2C:
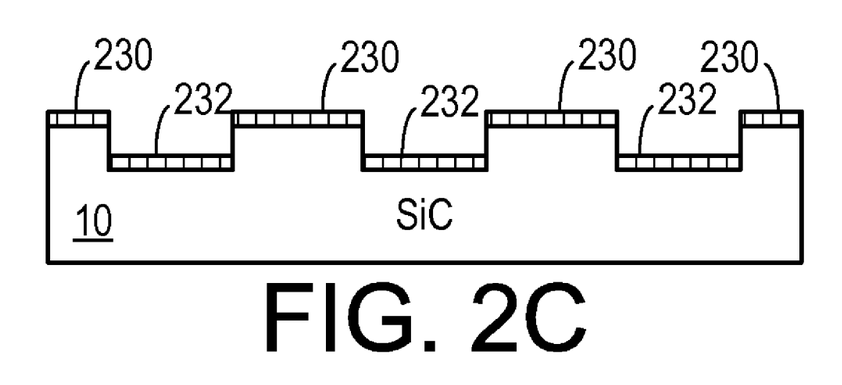

As shown in FIGS. 2A-2C, in an alternate embodiment, the mask 250 is applied directly to the crystal face of the substrate 10 prior to any annealing. The reactive substance 46 creates voids 260 in the substrate 10 and leaves plateaus 262 in areas covered by the mask 260. The mask 250 may be removed and the substrate 10 may be annealed to generate a high level graphitic layer 230 and a low level graphitic layer 232, both of which may be used if a suitable geometry is chosen.

Figure 3A:
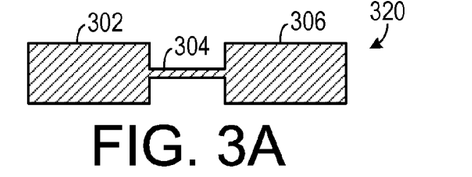
FIG. 3A-3G are plan view schematic diagrams showing a plurality of devices according to one embodiment of the invention.

As shown in FIG. 3A, a simple functional structure 320, such as an electronic device, made according to the invention, can be made by patterning the graphitic layer to have an electron source area 302 and an electron target, or drain, area 306 that are interconnected via a graphitic strip 304, which could be a graphene strip or a nano-scale graphite strip. The edges or the surface, or both, of the graphitic strip 304 may be functionalized with a dopant so that electron transport through the graphitic strip 304 may be affected by interaction between the dopant and the environment to which the graphitic strip 304 is exposed.

Figure 3B:
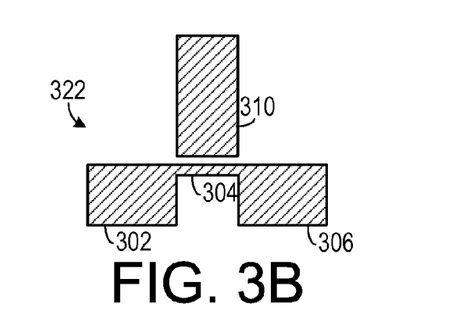
Figure 3C:
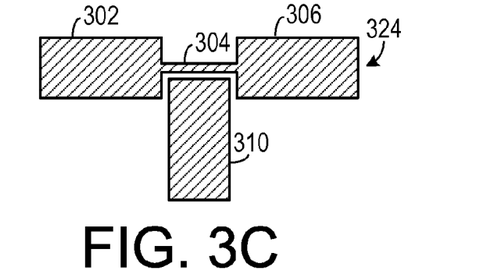
Figure 3D:
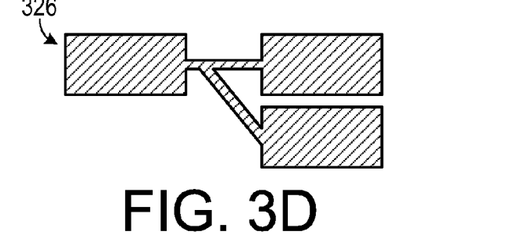

As shown in FIGS. 3B and 3C, a transistor may be made by disposing a gate area 310 adjacent to the graphitic strip 304 so that an electron transport property of the graphitic strip 304 changes when charge is applied to the gate portion so as to induce a field that interacts with the graphitic strip 304. A transistor can take the form shown as transistor 322 or transistor 324. A directional coupler 326 configuration is shown in FIG. 3D. The field may be, for example, an electric field or a magnetic field. As used herein, "gate" includes anything that generates field, whether magnetic or electrical, that can affect electron transport through a graphitic strip. It should be noted that Schottky-type gating is possible, in which case the gate electrode may be seamlessly connected to the graphitic strip.

Figure 3E:
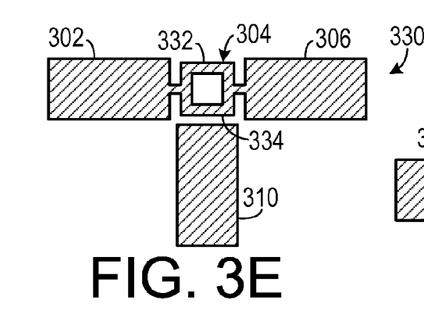
Figure 3F:
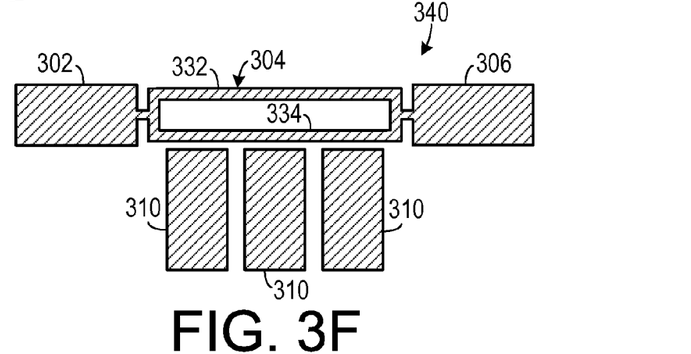
Figure 3G:
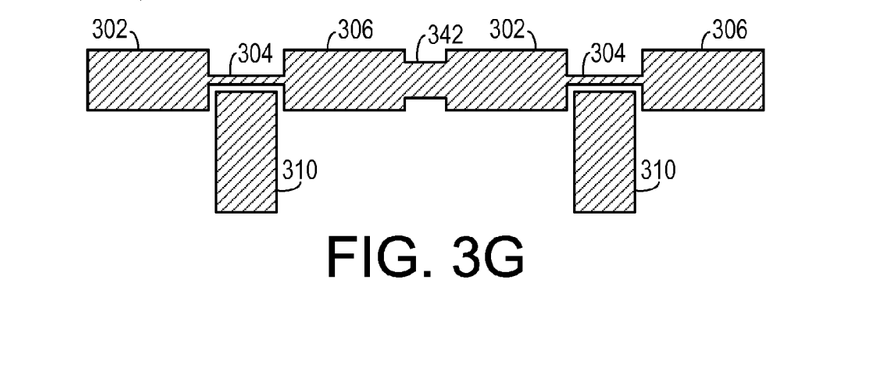

An interferometer configuration 330, such as a Mach-Zender interferometric device, is show in FIG. 3E. The interferometer configuration 330 includes a loop-like structure 304 that has a first branch 334 and a spaced-apart second branch 332 in electrical communication with the source member 302 and with the drain member 306. A gate member 310 is disposed adjacent to the first branch 334 so that it is capable of exerting an electrical field substantially only on the first branch 334. The interference may be sensed by a change in the source-to-drain current. Alternately, a sensor (not shown), such as a "beat" counter can be used to sense interference between electrons passing through the first branch 334 and electrons passing through the second branch 332. In this embodiment, a selected one of the first branch 334 or the second branch 332 may be doped with a functionalizing dopant. A multi-gate interferometric device 340, as shown in FIG. 3F, could be used to generate logic functions. One advantage of the invention is that compound devices, such as device 346 shown in FIG. 3G, may be formed entirely out of the graphitic layer, with inter-device connections 342 being formed from the graphitic layer. This would allow the formation of virtually all logic gates and electronic components used in computers and other electronic devices. Devices of the type shown could employ gates that are coplanar with the graphitic strips, or the gates could be in a stacked relationship if an insulator is applied between the graphitic strip and the gate.

These devices could include reactive molecules attached to the graphitic strips, either at the edges or on the surfaces, where the reactive molecules are capable of reacting to a target substance. Thus, if the target substance is present in an environment to which the graphitic strip is exposed, a change in current flow through the graphitic strip will occur as a result of the exposure. This configuration could find substantial utility in environmental sensor applications.

Figure 4A:
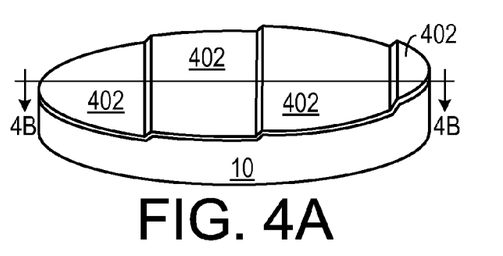
FIG. 4A is a top perspective view of a stair-stepped crystal with a graphitic thin film.
Figure 4B:
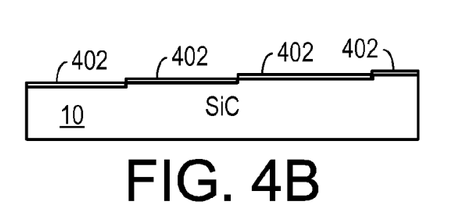
FIG. 4B is a cross-sectional view of the crystal shown in FIG. 4A, taken along line 4B-4B.

As shown in FIGS. 4A and 4B, the substrate crystal 10 may not be perfectly flat, but may have a stair-stepped surface 402 after flattening.

Figure 5:
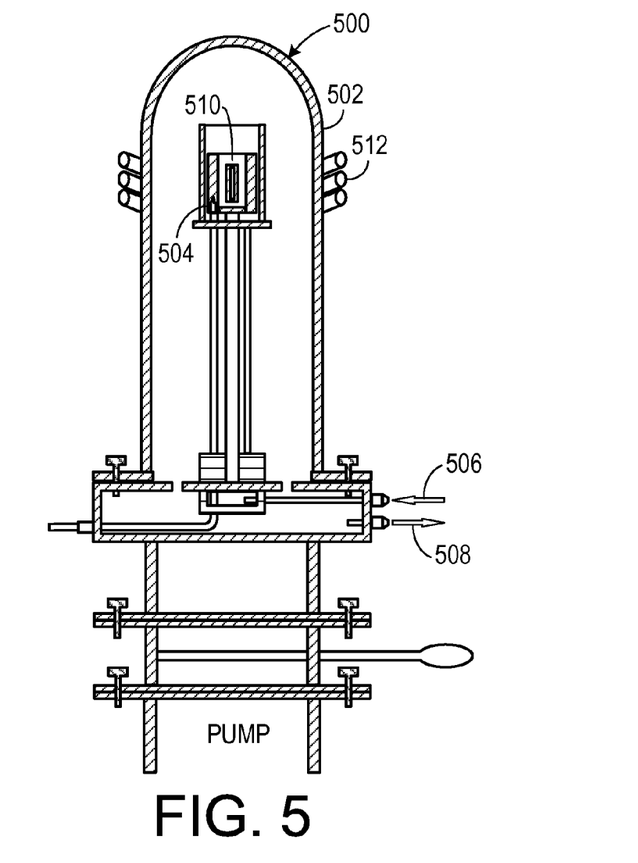
FIG. 5 is a schematic diagram of an experimental apparatus with which may be used for annealing a graphitic film.

One exemplary experimental apparatus 500 for making devices according to the invention includes a reaction vessel 502, a sample space 510 into which is placed the substrate, a gas intake 506 and a gas outlet 508. A heating element 512 applies heat to the vessel 502 and a thermocouple 504 may be employed to control temperature of the sample space 510. As will be appreciated by those of skill in the art, many other types of apparatus may be employed to make structures according to the invention.

With the invention, a continuous ultrathin graphite film (UTGF) on an insulating substrate is patterned, to produce an interconnected electronic device (i.e. integrated electronic circuit). The electronic structure of a strip of UTGF is related to that of a carbon nanotubes of similar dimensions, and it has properties that are similar to those of carbon nanotubes. For example, a narrow graphene strip (with a width from 1 to 100 nm) is a one dimensional conductor, is either metallic or semiconducting depending on its structure, and the band gap for a semiconducting graphene strip is inversely proportional to its width. It is expected that narrow graphene strips will be room temperature ballistic conductors on size scales of at least 100 nm.

The invention disclosed here has several advantages compared with nanotube-based electronics yet it retains the essential advantages of nanotube-based electronics. In particular, the invention allows production of integrated circuits of planar graphite devices. An important feature of the integrated structures is that the active elements (transistors, for example) and their interconnects are fashioned from a single graphite layer by patterning the graphite layer. In this way, the devices and the leads to the devices may be of the same graphitic material (i.e. UTFG) and they may be seamlessly connected to each other. This arrangement significantly reduces power dissipation at the lead-device contacts. Another advantage is that integrated circuits can be patterned using standard lithography techniques.

It should be noted that the inventors have experimentally demonstrated that ultra-thin graphite films produced on silicon carbide can be gated using the field effect. It is currently believed that thick graphite films cannot be gated.

Figure 6A:
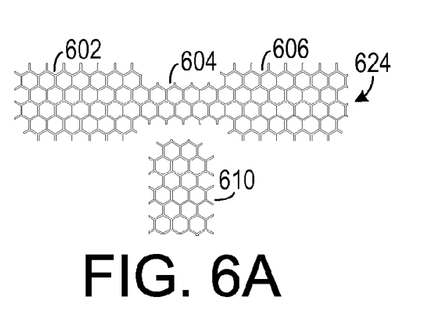
FIGS. 6A-E are schematic diagrams of several exemplary configurations of devices made according to the invention, taking into account crystal lattice orientation.
Figure 6B:
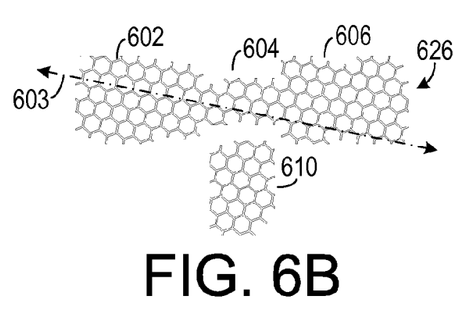
Figure 6C:
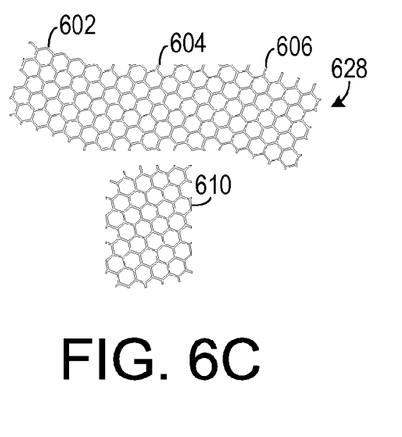
Figure 6D:
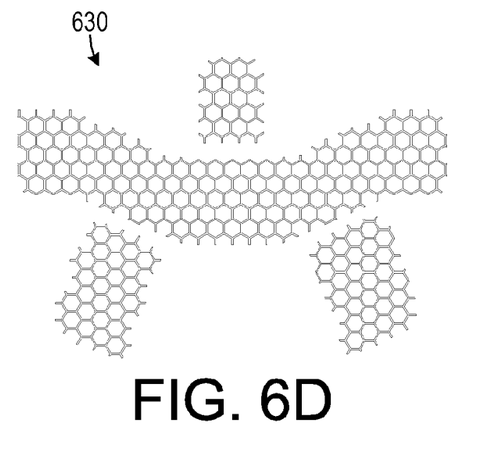
Figure 6E:
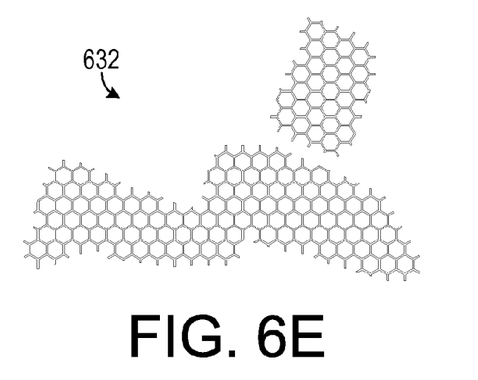

As shown in FIGS. 6A-6E, crystal orientation could affect electron transport from an electron source 602 to an electron target 606 through the graphitic strip 604, with a gate 610 affecting electron transport. It should be noted that FIGS. 6A-6E are schematic diagrams intending to give the impression of graphitic carbon rings in the devices shown and are not drawn to scale. Most graphitic devices would include many more carbon rings than shown. However, the lesser number of rings is shown for the sake of simplifying the image of the device. A device 624 taken along a linear orientation of carbon unit cells in shown in FIG. 6A. Orientation along another axis 603 may be chosen, as shown in FIG. 6B, which would render different electron transport properties. More complex devices 628 and 630, as shown in FIG. 6C and FIG. 6D, respectively, may take advantage of electron transport properties that change as crystal orientation changes. An irregular geometry may be chosen for the device 632, as shown in FIG. 6E, to take advantage of the electron transport property of such a configuration.

While not shown explicitly herein, graphitic structures typically have "hanging bonds" where a carbon atom is not bonded to at least three other carbon atoms, as is typical at the edge of a structure. Such hanging bonds are reactive and can be passivated by exposing them to hydrogen or functionalized by exposing them to a dopant. An advantage of functionalizing is that it could change the Fermi level in the structure so as to render a desired property in the structure.

Figure 7:
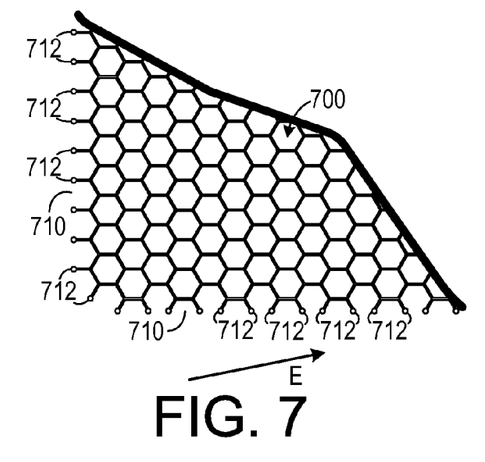
FIG. 7 is a schematic diagram of a portion of a graphene sheet with functionalized edges.

A shown in FIG. 7, in one example of a functionalized graphitic structure, a graphitic layer 710 has at least one edge 710 in which the hanging bonds are "decorated" with functionalizing molecules 712. The electrical properties of the functionalizing molecules 712 is modulated by the application of an electric field E.

Examples of functionalizing molecules include organic molecules, oxides and fluorides. Examples of suitable organic molecules include polyenes, functionalized single-walled carbon nanotubes, polyacetelyne, polycyclic aromatic hydrocarbons and conducting polymers. Methods of generating suitable organic functionalizing molecules are well known and are disclosed in, for example, U.S. Pat. Nos. 6,841,139; 6,875,412; 6,641,793; and 6,278,127, which are incorporated herein by reference. Functionalized single-walled carbon nanotubes may be formed by opening the nanotubes and terminating the open ends with carboxylate groups. Graphene ribbons may be chemically produced for example from branched polyphenylenes and may be used as bridging structures between larger graphitic structures.

Figure 8:
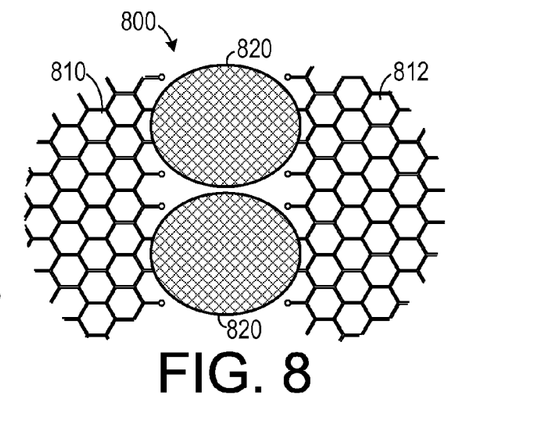
FIG. 8 is a schematic diagram of two separate graphene structures that are bridged with functionalizing molecules.

A band gap device 800 can be created, as shown in FIG. 8, by patterning a graphitic layer to include a first portion 810 and a spaced-apart second portion 812. Functionalizing molecules 820 may then be bound to the edges of the portions 810 and 812 to bridge the gap between them.

Figure 9A:
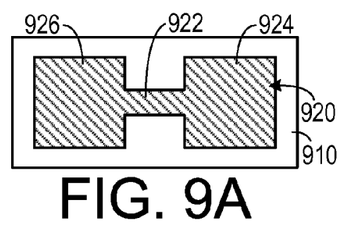
FIGS. 9A-F are a series of schematic diagrams showing formation of a graphene-based field effect transistor.
Figure 9B:
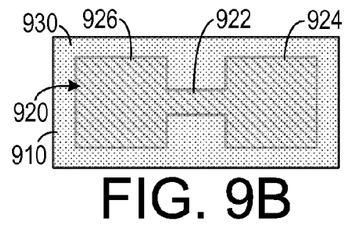
Figure 9C:
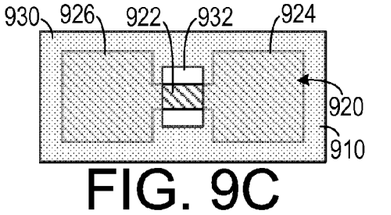
Figure 9D:
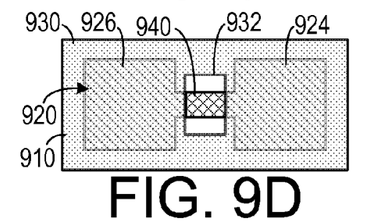
Figure 9E:
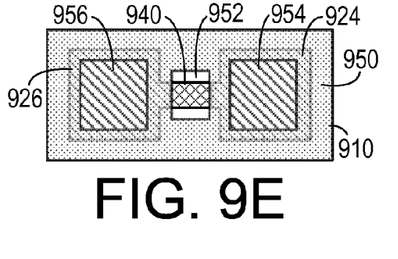

Functionalizing molecules may also be bound to the surfaces of patterned graphitic structures to create electronic devices. This may be accomplished by using well known lithographic techniques. In one example a graphitic field effect transistor may be made according to the method shown in FIGS. 9A-9F. Initially, a graphitic structure 920 is patterned onto a substrate 910. In this example, the graphitic structure 920 includes a first large portion 924 and a spaced-apart second large portion 926, which are connected to each other by a narrow graphene strip 922. A photoresist layer 930 is applied, as shown in FIG. 9B and an opening 932 is etched into the photoresist layer 930 so as to expose a portion of the narrow graphene strip 922. The exposed portion of the narrow graphene strip 922 is exposed to a reactant so as to form a functionalized portion 940 that includes functionalizing molecules. A second photoresist layer 950 is applied, into which are etched a first opening 954, a second opening 956 and a third opening 952. The first opening 954 exposes a portion of the first large portion 924; the second opening 956 exposes a portion of the second large portion 926; and the third opening 952 exposes a portion of the functionalized portion 940.

Figure 9F:
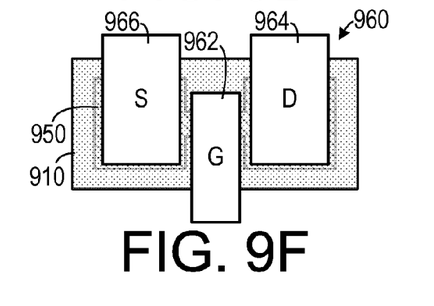

A first conductive contact 964 (made of, for example, a metal, polysilicon or another conductive material) forms a drain, a second conductive contact 966 forms a source and a third conductive contact 962 forms a gate. The functionalizing molecules are chosen so that a band gap exists between the functionalized portion 940 and the non functionalized portions of the graphitic structure 920. Thus, when a potential is applied to the gate, the current carrying characteristics of the functionalized portion 940 change, thereby either inhibiting current flow or allowing current flow through the transistor 960.

Attaching the organic molecules, in one illustrative example, involves a pyrolizing process in which the organic molecules are suspended in a liquid. The suspension is allowed to dry on the patterned graphitic layer, which is then heated in an inert environment to a temperature in the range of 300° C. to 1000° C. for one hour.

The invention solves two problems of nano-graphite electronics. It resolves the problem of patterning electronic structures on the very small size scale that is difficult to access using conventional patterning methods. (The lower limit of conventional lithographic patterning is about 10 nm.). It further resolves the problem of the molecule-to-conduit contact resistance.

A feature of this invention is that molecules are attached to the edges of nano-patterned graphite structures such that they electronically interact with the π bands of the top-down patterned NPEG structures. For example, these molecules may bridge a gap between two patterned graphite structures or they may be attached to the edges of the graphite structure with the purpose to alter the electronic properties of the top-down patterned NPEG structures.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. A method of making graphite devices, comprising the steps of:
   a. forming on a preselected face of a substrate, a thin-film graphitic layer disposed against the preselected face;
   b. generating a preselected pattern on the thin-film graphitic layer; and
   c. attaching at least one functionalizing molecule to a portion of the graphitic layer, wherein the functionalizing molecule is capable of interacting with π bands in the graphitic layer.

2. The method of claim 1, wherein the attaching action comprises binding the functionalizing molecule to an edge of the graphitic layer.

3. The method of claim 1, wherein the attaching action comprises binding the functionalizing molecule to a surface of the graphitic layer.

4. The method of claim 1, wherein the preselected pattern includes two spaced apart portions, each portion including an edge, wherein the attaching action comprises binding the functionalizing molecule to both of the edges, thereby bridging the two portions.

5. The method of claim 1, wherein the functionalizing molecule comprises an organic molecule.

6. The method of claim 5, wherein the organic molecule comprises a polyene.

7. The method of claim 5, wherein the organic molecule comprises a carbon nanotube.

8. The method of claim 5, wherein the organic molecule comprises a polycyclic aromatic hydrocarbon.

9. The method of claim 1, wherein the functionalizing molecule comprises an oxide.

10. The method of claim 1, wherein the functionalizing molecule comprises a fluoride.

11. A method of making graphite devices, comprising the steps of:
    a. forming on a preselected face of a substrate, a thin-film graphitic layer disposed against the preselected face;
    b. generating a preselected pattern on the thin-film graphitic layer; and
    c. attaching at least one organic functionalizing molecule to a portion of the graphitic layer, wherein the organic functionalizing molecule is capable of interacting with it bands in the graphitic layer.

12. The method of claim 11, wherein the attaching action comprises binding the functionalizing molecule to an edge of the graphitic layer.

13. The method of claim 11, wherein the attaching action comprises binding the functionalizing molecule to a surface of the graphitic layer.

14. The method of claim 11, wherein the preselected pattern includes two spaced apart portions, each portion including an edge, wherein the attaching action comprises binding the functionalizing molecule to both of the edges, thereby bridging the two portions.

15. The method of claim 11, wherein the organic functionalizing molecule comprises a material selected from a list consisting of: polyene, a carbon nanotube and a polycyclic aromatic hydrocarbon.

16. A method of making graphite devices, comprising the steps of:
    a. forming on a preselected face of a substrate, a thin-film graphitic layer disposed against the preselected face;
    b. generating a preselected pattern that includes two spaced apart portions, each portion including an edge on the thin-film graphitic layer; and
    c. attaching at least one functionalizing molecule to a portion of the graphitic layer by binding the functionalizing molecule to both of the edges, thereby bridging the two portions, wherein the functionalizing molecule is capable of interacting with π bands in the graphitic layer.

17. The method of claim 16, wherein the functionalizing molecule comprises an organic molecule.

18. The method of claim 17, wherein the organic functionalizing molecule comprises a material selected from a list consisting of: polyene, a carbon nanotube and a polycyclic aromatic hydrocarbon.

19. The method of claim 16, wherein the functionalizing molecule comprises an oxide.

20. The method of claim 16, wherein the functionalizing molecule comprises a fluoride.

* * * * *